United States Patent [19]

Moon et al.

[11] Patent Number: 4,833,344

[45] Date of Patent: May 23, 1989

[54] LOW VOLTAGE BIAS CIRCUIT

[75] Inventors: Philip A. K. Moon; Simon Atkinson, both of Wiltshire, United Kingdom

[73] Assignee: Plessey Overseas Limited, Ilford, England

[21] Appl. No.: 10,930

[22] Filed: Feb. 5, 1987

[30] Foreign Application Priority Data

Feb. 7, 1986 [GB] United Kingdom ................. 8603111

[51] Int. Cl.4 .......................... H03K 3/01; G05F 3/04

[52] U.S. Cl. .............................. 307/296.6; 307/296.1; 323/312; 323/315

[58] Field of Search .......................... 307/296.6, 296.1; 323/312, 315, 313; 330/296

[56] References Cited

U.S. PATENT DOCUMENTS

| | | | |
|---|---|---|---|
| 3,659,121 | 4/1972 | Fredriksen | 307/296 |
| 3,660,694 | 5/1972 | Lucas | 307/296 |
| 3,831,040 | 8/1974 | Nanbat et al. | 307/296 |
| 4,059,793 | 11/1977 | Ahmed | 307/297 |

FOREIGN PATENT DOCUMENTS 2007055 5/1979 United Kingdom .

OTHER PUBLICATIONS

"Low Complexity Reference Voltage Generator", IBM Technical Disclosure Bulletin, H. Beranger et al., vol. 24, No. 7A, Dec. 1981.

Gheorghiu et al., Optimum Design of Two Cascaded Peaking Current Sources, Aug. 1981, IEEE J. of Solid State Circuits, vol. SC-16, No. 4, pp. 415-417.

*Primary Examiner*—Stanley D. Miller
*Assistant Examiner*—Richard Roseen
*Attorney, Agent, or Firm*—Fleit, Jacobson, Cohn & Price

[57] ABSTRACT

A bias circuit (FIG. 5) of the type comprising a bias transistor (T1) having a pair of resistors (R1, R2) in its collector path, the junction of these two resistors (R1 and R2) being connected to the transistor base. The base of a drive transistor (T2), of like polarity type, is connected to the collector of the bias transistor (T1), this serving as current source or sink. To provide and increase extended operation, operation at supply voltages lower than usual and current regulation from low supply voltage (0.9V) to much high voltage, this circuit is modified by the provision of a third resistor (R3) in the collector path and a diode shunt (T3) between the base of the drive transistor T2 and the junction of the third and first resistors (R3 and R1). The polarity inverse of this modified circuit is also effective and may be combined, in cascade or in ring feedback loop configuration, with the aforementioned modified circuit. These latter combinations serve to provide yet higher order current regulation.

2 Claims, 4 Drawing Sheets

LOW VOLTAGE BIAS CIRCUIT

TECHNICAL FIELD

The present invention concerns improvements in or relating to bias circuits, notably circuits that will provide constant bias current and will operate from a low supply voltage—eg. a supply voltage of the order 0.9 volts.

BACKGROUND ART

When designing circuits the need often arises to generate an accurate current bias from the supply. A possible known way of doing this is illustrated by the basic circuit shown in FIG. 1 of the accompanying drawings. This comprises a drive transition T2 the voltage and current reference for which is generated by means of a resistor R1 and series-connected diode-configured bias transistor T1. At start-up base current is drawn via resistor R1 whilst the diode-transistor T1 is reverse biassed. As the supply voltage rises the diode-transistor T1 turns on claMping the drive transistor T2 to a fixed base voltage, the forward bias voltage of the diode. This sample bias circuit, unfortunately has a number of drawbacks, namely direct supply dependence, transistor gain dependence and poor tolerance on low supply voltage.

A known variant of this basic circuit is also shown in FIG. 2. Here the single resistor R1 is replaced by a pair of resistors R1, R2 which serve as a voltage/current divider. The junction of the two resistors R1 and R2 is connected to the base of the bias transistor T1, and the collector of the bias transistor T1 now connected to the base of the drive transistor T2. This arrangement is also described in United kingdom Patent Application No: GB No. 2007055. This circuit variant provides better supply voltage rejection and also a degree of transistor compensation. It will not however operate down to low supply voltages of the order 0.9 V or so, without substantial optimisation. The response of the optimised circuit, characteristic C1, is shown in the graphical representation of FIG. 4, where the circuit has been optimised by scaling resistor values and transistor emitter area ratio for use at low voltages. The peak of the output current occurs below 0.7 V and the output current falls to zero by 1 V or so. This clearly is not suitable for supply voltages which rise to high voltages from 0.9 V upwards, and tnhis presents a problem.

It is aalso known to cascade the modified circuit shown FIG. 2 with its inverse circuit, to provide higher order current linearisation, ie. for better current regulation. This is shown in FIG. 3, where the simple current source resistor R1 is replaced by a more complex current source consisting of the inverse circuit comprising a drive transistor T2', a bias transistor T1', both of polarity type the reverse of transistors T1 and T2, and a collector load comprising a pair of resistors R1' and R2' connected in series and tapped to provide feedback to the base of the bias transistor T1'. Details of this cascade structure are given in the Article entitled "Optimum Design of Two Cascaded Peaking Current Sources" by V. Gheorghiu et al., IEEE Journal of Solid-State Circuits, Vol SC-16 No. 4 August 1981 pages 415–417. Typical current-voltage characteristics C2, C3 are also shown in FIG. 4.

DISCLOSURE OF THE INVENTION

The present invention is intended to provide a bias circuit that will provide current regulation down to every low supply voltage levels (eg. levels of the order 0.9 V), and will work at every low supply currents. It thus provides a solution to the problem aforesaid.

According to the present invention there is provided a bias circuit comprising:

a bias transistor the collector path of which includes a first and a second resistor, a feedback connecting being made between the junction of these two resistors and the base of the bias transistor; and, a drive transistor, the base of which is connected to the collector of the bias transistor;

characterised by the addition of a third resistor in the collector path of the bias transistor; and, a diode connected between the junction of the first and third resistors and the base of the drive transistor.

Conveniently, the diode may be provided by an appropriately configured transistor of the reverse polarity type to the type of transistor used for bias and drive.

The bias and drive transistors may be chosen to be NPN polarity-type, the bias circuit serving thus as a current drain. Alternatively, the reverse polarity type of transistor, PNP, may be adopted for these transistors, the bias circuit seriving then as a current source.

The aforesaid circuit and its polarity-type inverse may be cascaded together to form a combination circuit, for high order regulation. Further circuit and inverse pairs may be added in cascade, also.

Both the aforesaid circuit, its inverse the circut cascade combinations are self-starting.

Alternatively, the circuit and its inverse may be configured in a feedback loop arrangement for yet improved current regulation. Such a circuit, however is not self-starting and a current injection or extraction start-up source must be added at a point in the loop.

BRIEF INTRODUCTION OF THE DRAWINGS

In the drawings accompanying this specification:

DESCRIPTION OF PREFERRED EMBODIMENTS

So that this invention may be better understood, embodiments thereof will now be described with reference to the accompanying drawings. The description that follows is given by way of example only.

Figure 5:
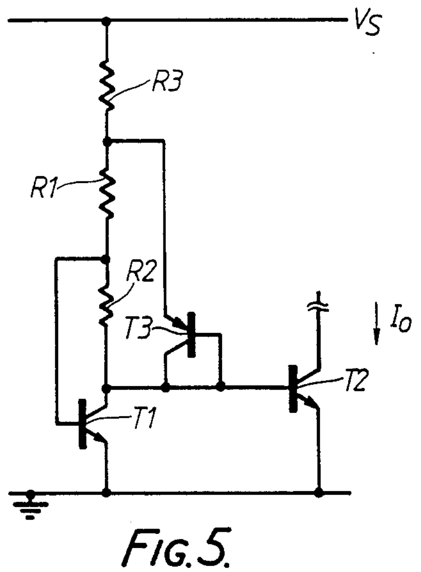
FIG. 5 is a circuit diagram of a bias circuit modified in accord with the present invention.

The circuit shown in FIG. 5 is similar to that already described with reference to FIG. 2, comprising thus a bias transistor T1 having a pair of resistors R1 and R2 in its collector path, the base of this bias transistor T1 being connected to the junction of the two resistors R1 and R2. The collector of this bias transistor T1 is connected to the base of a drive transistor T2. Both the bias transistor T1 and the drive transistor T2 are of NPN polarity-type. This circuit is modified by the provision of a third resistor R3, also in the collector path of the bias transistor T1, which resistor R3 is connected between the supply voltage rail $V_S$ and the first resistor R1. The current path R1, R2 is shunted by means of a diode, here shown as a collector-base connected PNP transistor T3. This diode T3 is connected between the junction of the first and third resistors R1 and R3, and the base of the drive transistor T2.

Figure 1:
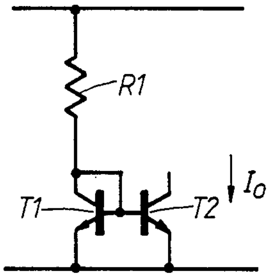
FIG. 1. PRIOR ART
FIGS. 1 to 3 are circuit diagrams of a basic known bias circuit and more complex variants.
Figure 2:
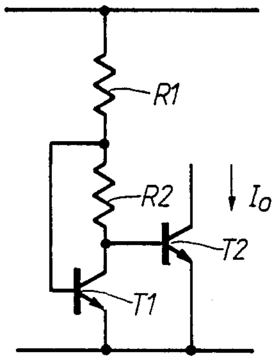
FIG. 2. PRIOR ART
Figure 3:
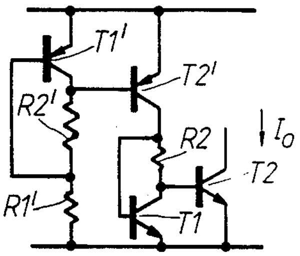
FIG. 3. PRIOR ART
Figure 4:
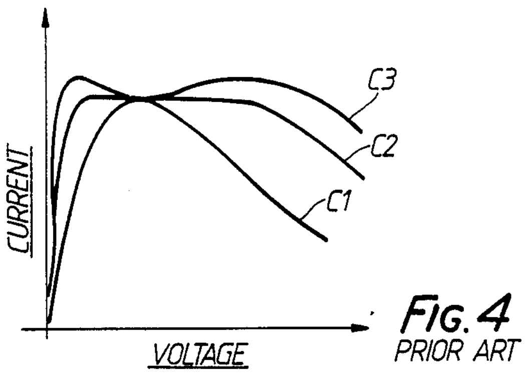
FIG. 4 PRIOR ART
FIG. 4 is a graph showing the current-voltage characteristics of the circuits shown in the preceding figures.
Figure 6:
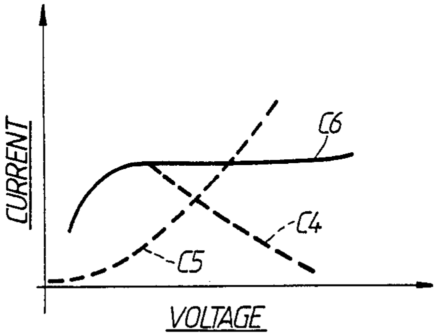
FIG. 6 is a graph showing the current-voltage characteristic of the modified circuit shown in the preceding figure.

At low supply voltages this circuit behaves as previously described for the circuit shown in FIG. 2. Here the supply voltage is so low that no appreciable current will flow through the diode-transistor T3. If the values of the resistors R1, R2 and R3 are chosen correctly, the effect latter of this diode-transistor T3 drawing current, as the voltage rises, will be to clamp the current flow through the collector resistors R1 and R2, and also to provide increased base current to drive the drive transistor T2. There are thus introduced two opposing effects—one due to current fall-off at higher supply voltage, the other due to increased base current fed via the diode—transistor T3. (See dotted outlines C4, C5 respectively in FIG. 6). The combined effect is to produce a well regulated current over an extended range of supply voltage from very low voltage less than 0.9 V, to high voltage. This is shown by the effective characteristic C6 of this circuit (See bold outline C6 in FIG. 6).

The circuit just described acts as a well regulated current sink. By inverting this circuit between the supply voltage rail $V_S$ and circuit ground, and by adopting bias, drive and diode transistors T1', T2' and T3' of the reverse polarity type ie. PNP, PNP and NPN-type respectively, a current source circuit may be provided—See FIG. 7.

Figure 7:
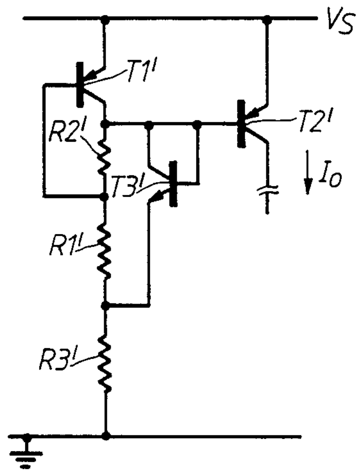
FIG. 7 is a circuit diagram of the inverse of the modified circuit shown in FIG. 5.
Figure 8:
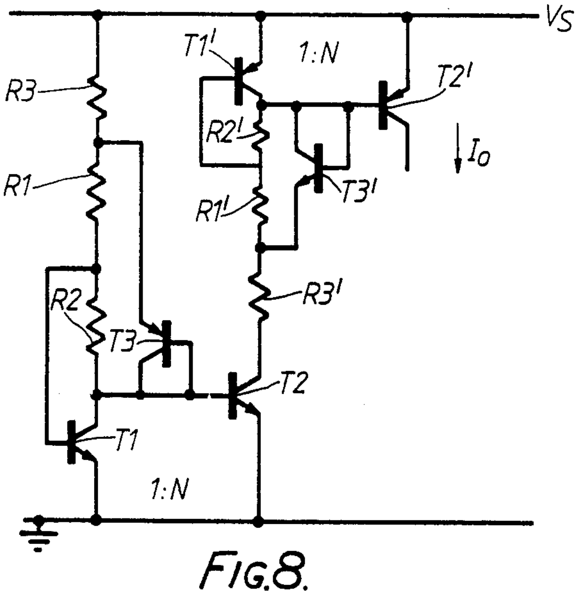
FIGS. 8 and 9 are circuit diagrams of more complex combination circuits, a cascade circuit and a loop circuit, respectively, each based upon combination of the modified circuit and its inverse shown in FIGS. 5 and 7.

For better current regulation, it is possible to cascade the modified circuit (FIG. 5) and its inverse (FIG. 7). This is shown in FIG. 8.

Figure 9:
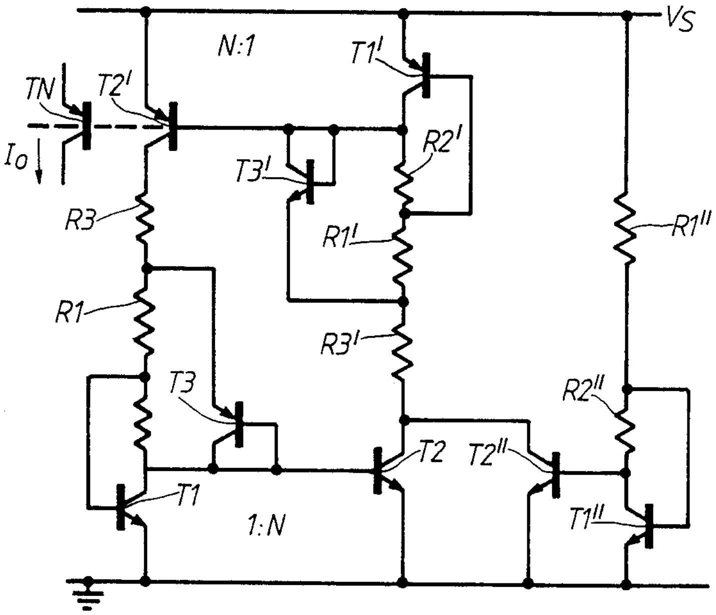

It is also possible to connect the modified circuit (FIG. 5) and its inverse in a ring or loop configuration. The drive transistors T2, T2' then are connected in the collector path of the bias transistor T1', T1 of the other sub-circuit. This configuration, however, alone has no base leakage and is thus not self-starting. A start-up current source must thus be connected at a point in the feedback loop—ring arrangement. A convenient subcircuit for doing this is shown in FIG. 9 and is connected to the collector of the drive transistor T2 of the modified sub-circuit. It comprises a circuit hiaving similar arrangement to that shown in FIG. 2 above comprising thus a pair of resistors R1'', R2'' in the collector path of a bias transistor T1''. Feedback, as previously, is provided between the junction of the two resistors R1'', R2'' and the base of this bias transistor T1''. The collector of this bias transistor T1'' is connected to the base of a drive transistor T2'', which serves thus as a current sink for extracting start-up current from the ring circuit T1 to T3'. The value of the second resistor R2'' of this start-up circuit has been allocated a higher than usual value so that the start-up circuit T1'' to T2'' exhibits a sharply peaked low-voltage current-voltage characteristic.

FIELD OF APPLICATION

The intended application for the above described circuits is to integrated circuit design for Radio Paging Receivers. The circuit design for such devices is not straight forward due to low battery voltage requirements (end life 0.9 V) and low current consumption. However, the invention will find application to other low supply, low current circuits.

Having described the invention and the manner in which it may be performed, we claim:

1. A ring circuit comprising: a first bias sub-circuit including:
   an NPN bias transistor having a base, an emitter, and a collector;
   three resistors connected in series with the collector of this transistor, two of the resistors nearest to the collector being connected to the base of the NPN bias transistor;
   an NPN drive transistor, the base of which is connected to the collector of the NPN bias transistor, and the emitter of which transistor is connected directly to the emitter of the NPN bias transistor; and,
   a first diode connecting the base of this NPN drive transistor to a point between two of the resistors furthest from the collector of the NPN bias transistor;
a second bias sub-circuit including:
   a PNP bias transistor having a base, an emitter, and a collector;
   three further resistors connected in series with the collector of this PNP bias transistor, two of the further resistors nearest to the collector of the PNP bias transistor being connected from a point therebetween to the base of the PNP bias transistor;
   a PNP drive transistor having a base, an emitter, and a collector, the base of which transistor is connected to the collector of the PNP bias transistor, and the emitter of which transistor is connected directly to the emitter of the PNP bias transistor;
   wherein, the collector of each drive transistor is connected to the three and three further resistors, respectively, each at a point furthest from the collector of the bias transistor to which said resistors are connected, to connect first and second bias sub-circuits in a ring; together with,
   a start-up circuit, connected to a point in the ring, for injecting or extracting a priming current.

2. A ring circuit, as claimed in claim 1, wherein the start-up circuit comprises:
   a bias transistor having a base, an emitter, and a collector;
   a pair of series connected resistors connected to the collector of this bias transistor, these two resistors being connected from a point therebetween to the base of this bias transistor; and,
   a drive transistor having a base, an emitter, and a collector the base of which transistor is connected to the collector of this bias transistor, wherein the value of resistance of the resistor nearest the collector of this bias transistor is such that the start-up circuit has a current-voltage characteristic that is strongly peaked at low voltage.

* * * * *